United States Patent [19]

Lewiner et al.

[11] Patent Number: 4,739,349
[45] Date of Patent: Apr. 19, 1988

[54] DEVICES FOR MAKING ELECTRIC CHARGE IMAGES VISIBLE

[76] Inventors: Jacques Lewiner, 5, rue Bory d'Arnex, 92210 Saint Cloud; Georges Charpak, 37, rue de la Plaine, 75020 Paris, both of France

[21] Appl. No.: 942,762

[22] Filed: Dec. 17, 1986

[30] Foreign Application Priority Data

Dec. 27, 1985 [FR] France ................ 85 19313

[51] Int. Cl.⁴ .......................... G01D 15/10
[52] U.S. Cl. .................... 346/160; 355/3 EH
[58] Field of Search ............ 358/213.12, 194–204, 358/206, 208, 212; 346/160, 153.1; 355/3 CH, 3 D, 14 CH; 354/6; 101/DIG. 13; 340/811, 813, 814

[56] References Cited

U.S. PATENT DOCUMENTS 4,571,603  2/1986  Hornbeck et al. ................ 346/160
4,672,399  6/1987  Dahlquist ........................ 346/160

*Primary Examiner*—Arthur G. Evans
*Attorney, Agent, or Firm*—Larson and Taylor

[57] ABSTRACT

For displaying "electric" images recorded in the form of charges (+) on a dielectric sheet (1), this sheet is surrounded by two electrodes (2,3) one (3) of which is transparent, on the face of this latter turned towards the dielectric sheet is provided a layer (4) of an electroluminescent material held spaced at a small distance from said sheet, this sheet is caused to vibrate perpendicularly to itself (arrows F) and the image developed at the level of the layer (4) by the alternating electric charges generated by the vibrating charges is recorded on a photographic support (5).

10 Claims, 1 Drawing Sheet

DEVICES FOR MAKING ELECTRIC CHARGE IMAGES VISIBLE

The present invention concerns electric image formation.

More precisely, it relates to display devices for producing visible images from "electric" images, i.e. recorded on a dielectric sheet in the form of electric charges distributed in the vicinity of a surface of this sheet.

DESCRIPTION OF RELATED ART

In the present description, the word "sheet" will be interpreted as designating not only a sheet properly speaking but also any similar support such as a plate or a drum or even a layer coating such a support.

The electric images concerned are for example those which are generated by the impact of an X-ray beam on a dielectric sheet after passing through a heterogeneous body whose different components present different degrees of transparency to said radiation.

It is known that this technique is currently applied to the internal examination of opaque bodies with visible light, in particular for the purpose of checking metal parts or for medical diagnosis purposes.

To read or display such electric images, i.e. for producing visible images from these electric images, electrostatic inking can be used, which is relatively delicate and expensive. The sheet bearing the electric images may also be scanned, the sheet being placed on a conducting support forming a first electrode, by means of a conducting probe1 held closely spaced from the sheet and itself forming a second electrode, the electric charges to be read inducing image charges in this probe: said probe is associated with an electronic circuit adapted for elaborating at each moment an electric signal whose amplitude is related to the amount of the image charge induced at that moment, and the succession of such signals is used for visual reproduction purposes in any desirable way.

Such reading of images by scanning is relatively long and expensive, especially if a fine resolution is desired for the visible images produced: thus, if the spatial resolution desired is 0.1 mm and if the response time of reading is 10 ms for each area to be identified of the dielectric sheet carrying the electric image to be read, the reading of an image of $20 \times 30$ cm$^2$ requires more than 16 hours.

SUMMARY OF THE INVENTION

The purpose of the invention is especially to overcome this drawback by making the display of electric images substantially instantaneous or at any rate very rapid.

For this, the display device of the invention further includes two electrodes enclosing the electrically charged dielectric sheet and these devices are essentially characterized in that they further include:

a developer element each area of which is adapted to emit or modify light radiations when it is subjected to an alternating electric field, which element is placed opposite the dielectric sheet at a small distance d therefrom and between the two electrodes, means for creating between the dielectric sheet and the electrode situated on the same side of this sheet as the developer element a reciprocal movement oriented so as to move this electrode alternately towards and away from this sheet so as to cause alternating electric fields, of sufficient amplitude to cause said development, to be applied locally on the developer element by the electric charges carried by the sheet, and photosensitive means arranged so as to record the light radiations coming from the developer element at relative positions identical to those occupied on the dielectric sheet by the electric charges which are at the origin of such radiations.

In preferred embodiments, recourse is further had to one/or the other of the following arrangements, the developer element is a sheet extending parallel to the dielectric sheet and the electrode situated on the same side of the dielectric sheet as said developer sheet is a conducting sheet transparent to visible light, in a display device according to the preceding paragraph, means are provided for moving the developer sheet parallel to this sheet, the developer element is a ribbon or strip bonded to a conducting ribbon or strip forming one of the two electrodes and means are provided for causing this composite ribbon or strip to travel in a direction perpendicular to said ribbon or strip and parallel to the dielectric sheet so as to cause it to describe the whole of the surface of this sheet, or conversely, in a display device according to the preceding paragraph, the alternating movements moving the dielectric sheet and the composite ribbon or strip mutually towards or away from each other are obtained by moving this composite ribbon or strip, the above developer ribbon is a sheath surrounding a thin conducting wire forming one of the two electrodes, the dielectric sheet and the electrode situated on the same side of the developer element as this sheet are both formed of materials transparent to visible light, the alternating movements generated between the dielectric sheet and the developer element are vibrations whose frequency is between 10 Hz and 5 kHz and whose amplitude is of the order of d/2, the distance d being itself preferably of the order of 50 to 100 microns, the photosensitive means are formed by a photographic sheet.

The invention comprises, apart from these main arrangements, certain other arrangements which are preferably used at the same time and which will be more explicitly discussed hereafter.

BRIEF DESCRIPTION OF THE DRAWINGS

In what follows, some preferred embodiments of the invention will be described with reference to the accompanying drawings in a way which is of course in no wise limiting.

DESCRIPTION OF THE PREFERRED EMBODIMENTS

Figure 1:
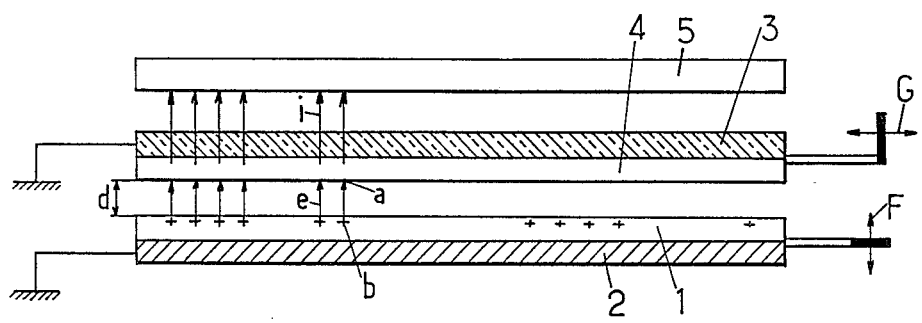
Figure 2:
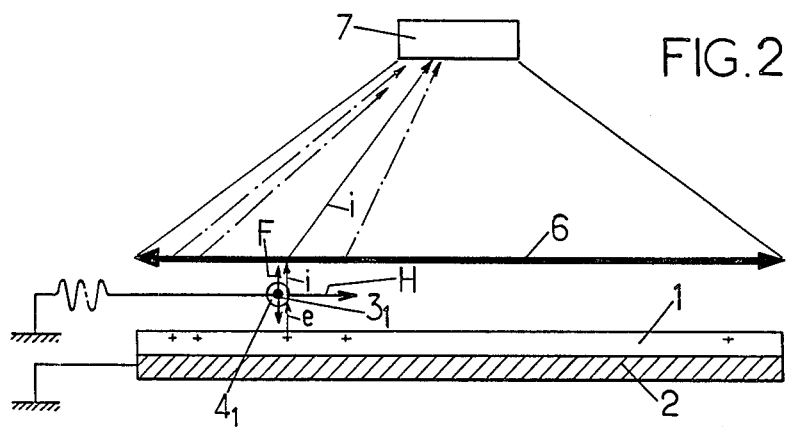
Figure 3:
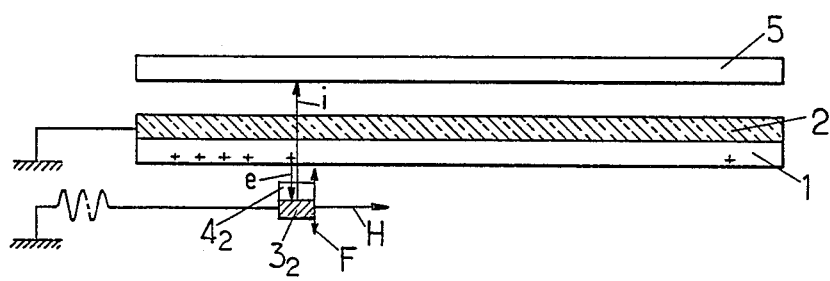

FIGS. 1, 2 and 3 of these drawings show very schematically three display devices constructed in accordance with the invention.

The "electric" image which it is desired to reproduce visually has been previously formed by selective "electrization" of a dielectric sheet 1.

This sheet 1 may be in the form of a sheet properly speaking or in the form of any other support (strip, disk, drum ...) extending essentially over two dimensions and whose third dimension corresponds to a relatively small thickness. This thickness is generally between 10 and 1000 microns.

The dielectric forming the sheet 1 must be able to keep the electric charges for a certain time: it is a question more epecially of an insulating material, for example of a plastic type (polypropylene, ethylene polyterephtalate, polytetrafluoroethylene, polyamide, ...) or of a mineral type (glass, ...) or else a photoconducting material (cadmium sulphide, selenium, polyvinylcarbazol, ...)

For a particularly advantageous application, the image is formed by means of an X ray beam passing through a body opaque to light, the sheet then being formed more particularly by a selenium or selenium based plate.

When the opaque body is heterogeneous, i.e. presents components whose degrees of transparency to the X rays are more or less high, said image has, in correspondence with such components, areas charged electrically to a higher or lesser degree as a function of these degrees of transparency.

The invention provides then for making these charge difference visible, i.e. to reconstitute therefrom an image causing the components in question to appear in their own positions and with their own opacities.

For this, one fact of sheet 1 is applied against a conducting sheet 2 forming a first electrode and opposite the other face of this sheet 1, at a small distance d from this other face, a conducting element 3 is placed forming a second electrode itself coated with a developer element 4 on its face turned towards sheet 1.

Each of the two electrodes 2 and 3 is grounded.

The developer element 4 is formed of a material capable of emitting or modifying light radiations at each of its points when this point is subjected to an alternating electric field of sufficient amplitude.

This material is for example a liquid crystal or an electroluminescent substance such as a zinc sulphite, particularly activated by copper, or a zinc sulphoseselenide.

The continuous electric field which is generated by the electric charges trapped in the dielectric sheet 1, charges shown schematically in the drawing by + is not sufficient to initiate "development" of element 4, i.e. to cause it to emit light radiations locally: at rest, these charges simply induce image charges of opposite sign in the developer and the electric procedure is then blocked.

To replace the continuous electric field above by an alternating electric field able to initiate the above "development", it is sufficient to cause sheet 1 to vibrate with respect to electrode 3: the inventors have discovered that suprizingly this measure is sufficient to attain the desired aim.

In other words, and in accordance with the invention, sheet 1 is subjected to vibrations—schematized by the arrow F in FIG. 1—in a direction perpendicular to the surface of this sheet so as to move it alternately towards and away from the developer element 4 bonded to electrode 3.

The frequency of these vibrations is preferably between 10 Hz and 2 kHz and their amplitude is of the order of d/2.

The distance d must be both:
fairly small so that the electric field lines are not distorted too much when passing through the gap between the dielectric sheet 1 and the developer element 4,
and large enough so that there is no risk of the facing faces of these two components colliding.

In practice, this distance d is advantageously of the order of 50 to 100 microns.

Such spacing is maintained by appropriate means, for example by means of small studs made from a compressible material such as a foam. The vibrations in question are generated in any desirable way, in particular using an electromagnetic or piezo-electric device.

The simple face of applying these vibrations to the dielectric sheet 1 and/or to electrode 3 results in an overall display on the developer element 4 of the image recorded electrically on the dielectric sheet 1.

In the embodiment schematized in FIG. 1, the second electrode 3 and the developer element 4 are both formed by sheets bonded one to the other and the image displayed on sheet 4 is directly recorded on a photographic sheet or plate 5 which is disposed proximate the face of the conducting sheet 3 the furthest away from the developer sheet 4 or in the focal plane of an appropriate optical system.

Of course, on such an assumption, said conducting sheet 3 is made from a transparent conducting material, such as indium and tin oxide (ITO) and the developer sheet 4 must also be transparent.

The photosensitive support for recording the visible image developed may also be directly the eye of an observer.

The thickness of each of the two sheets 1 and 4 is between a few microns and 200 microns.

If we consider as "longitudinal" the direction of vibrations F, i.e. the direction perpendicular to the means plane of the dielectric sheet 1, if further the longitudinal position of the assembly of sheets 3 and 4 remains invariable and if finally we call a each point of the space situated at the level of sheet 4 in which a given electric charge b of the dielectric sheet 1 generates light radiation when this charge is subjected to the vibration F, the transverse position of said point a remains invariable even if the sheet 4 is moved traversely.

In fact, this point a is constantly situated on the straight line parallel to the longitudinal direction passing through the charge b.

Now, the developer sheet 4 is generally formed of a heterogeneous material whose different points do not present totally identical "development" characteristics, some of these points being situated for example in bulging zones of developer grains and others on the contrary in anfractuosities between two such adjacent grains.

If then we subject the developer sheet to alternating transverse movements G, the emission of light observed at each fixed point a of the space, during vibration of the corresponding charge b, varies and it is advantageous to be able to work out the mean of the light emissions thus produced successively at each fixed point a by the real pinpoint areas of the dielectric sheet 4 which pass at this point a.

Now, the visible image finally recorded on sheet 5 by exposure thereof during a given period corresponds automatically to such a mean for said period. Thus any visual restoration defect which is due to the heterogeneity of the developer may be overcome.

The amplitude of the transverse movements G is more particularly of a few millimeters, these movements are advantageously rectilinear movements to and fro and their frequency is determined so that several of such to and fro movements are effected during the exposure period corresponding to recording of each visible image on support 5: this period which corresponds to that during which the vibrations F are generated, is generally of the order of a few seconds.

To allow a correct flow of the air between the two adjacent laminated elements 1-2 and 3-4 subjected to relative vibrations, fine perforations may be formed in one at least of these two elements.

In an interesting variant, the laminated element 3-4 is formed not by a composite sheet but by a ribbon or strip stretched parallel to the dielectric sheet 1, at a distance d therefrom, and moved perpendicularly thereto and parallel to said sheet 1 in the direction of arrow H (FIGS. 2 and 3) so as to described the whole of said sheet.

In a first embodiment of this variant, illustrated in FIG. 2, the second electrode is formed by a thin conducting wire $3_1$ and the developer element forms a sheath $4_1$ surrounding this wire $3_1$.

It is in this case this wire itself which is subjected to the above-defined vibrations F.

Considering the great fineness of wire $3_1$, the light radiations generated in sheath $4_1$ are visible all around this wire even if their main source is situated on the side, of said wire, oriented towards the dielectric sheet 1: this is what allows said radiations to be displayed from the side, of wire $3_1$, the furthest away from sheet 1.

Such visualization is preferably again provided by direct observation or by direct recording on a photosensitive support of the kind designated by reference 5 in FIG. 1.

In the version shown schematically in FIG. 2, the visualization or display is effected by means of an optical system 6 and a local or remote controlled visual restoration and/or recording apparatus 7 associated with said system 6: this apparatus 7 is for example of the television camera or video tape recorder type.

These latter types of display could of course be also adopted in the case of an overall or simultaneous development of the electric images in accordance with the variant of FIG. 1: they may be even especially contemplated on such an assumption.

In the second embodiment of the ribbon or strip variant, embodiment shown in FIG. 3, the second electrode is a conducting strip $3_2$ extending parallel to the dielectric sheet 1 and coated with a developer layer $4_2$ on its face turned towards sheet 1.

Since strip $3_2$ is opaque, the visualization takes place through the assembly of the two sheets 1 and 2, which are therefore both provided transparent to visible light.

As for FIG. 1, the procedure is by direct observation or direct recording on a photosensitive support 5.

In each figure, the alternating electric fields produced by the electric charges to be read have been shown by arrows e and the light radiations used for reading by arrows i. To avoid any risk of electric discharge in the gas layer separating the dielectric sheet 1 from the developer 4, the air forming this layer may be replaced by a gas having a greater electric rigidity, such as Freon.

Following which and whatever the embodiment adopted, a device is finally obtained for reading electric images whose construction, operation and advantages (particularly the possibility of reading very rapidly and very simply "electric" images created from a weak penetrating radiation beam) follow sufficiently from the foregoing.

As is evident, and as it follows moreover already from what has gone before, the invention is in no wise limited to those of its modes of application and embodiments which have been more especially considered; it embraces, on the contrary, all variants thereof particularly those where the main construction of FIG. 3, concerning the respective paths of the electric fields e and of the light radiation i is applied to a sheet construction of the kind shown in FIG. 1: in this case, the developer sheet and the electrode sheet bonded thereto may be opaque and it is the other electrode sheet and the dielectric sheet which are transparent to visible light.

We claim:

1. A display device for producing visible images from "electric" images, i.e. recorded on a dielectric sheet in the form of electric charges distributed in the vicinity of a surface of this sheet, comprising two electrodes which enclose said sheet, characterized in that it further includes a developer element each area of which is adapted to emit or modify light radiations when it is subjected to an alternating electric field, which element is placed opposite the dielectric sheet, at a small distance d from this sheet, and between the two electrodes, means for creating between the dielectric sheet and the electrode situated on the same side of this sheet as the developer element an alternating movement oriented so as to move this electrode and this sheet alternately towards or away from each other so as to cause alternating electric fields of sufficient amplitude for causing said development to be applied locally on the developer element, by the electric charges carried by the sheet and photosensitive means adapted so as to record the light radiations from the developer element at relative positions identical to those occupied on the dielectric sheet by the electric charges which are at the origin of such radiations.

2. The display device according to claim 1, characterized in that the developer element is a sheet extending parallel to the dielectric sheet and transparent to visible light and in that the electrode situated on the same side of the dielectric sheet as said developer sheet is a conducting sheet transparent to visible light.

3. The display device according to claim 2, characterized in that means are provided for moving the developer sheet parallel to this sheet.

4. The display device according to claim 1, characterized in that the developer element is a ribbon or strip bonded to a conducting ribbon or strip forming one of the two electrodes and in that means are provided for causing this composite ribbon or strip to travel in a direction perpendicular to said ribbon or strip and parallel to the dielectric sheet so as to cause it to described the whole of the surface of this sheet, or conversely.

5. The display device according to claim 4, characterized in that the alternating movements moving the dielectric sheet and the composite ribbon or strip mutually towards or away from each other are obtained by moving this composite ribbon or strip.

6. The display device according to claim 4, characterized in that the developer ribbon is a sheath surrounding a thin conducting wire forming one of the two electrodes.

7. The display device according to claim 1, characterized in that the dielectric sheet and the electrode situated on the same side of the developer element as this sheet are both formed of materials transparent to visible light.

8. The display device according to claim 1, characterized in that the alternating movements generated between the dielectric sheet and the developer element are vibrations (F) whose frequency is between 10 Hz and 2 kHz and whose amplitude is of the order of d/2.

9. The display device as claimed in claim 1, characterized in that the distance d is of the order of 50 to 100 microns.

10. The display device according to claim 1, characterized in that the photosensitive means are formed by a photographic sheet.

* * * * *